United States Patent
Boescke

(10) Patent No.: US 11,881,824 B2
(45) Date of Patent: Jan. 23, 2024

(54) TRANSIMPEDANCE AMPLIFIER AND RECEIVER CIRCUIT FOR OPTICAL SIGNALS WITH A PHOTODIODE AND A TRANSIMPEDANCE AMPLIFIER

(71) Applicant: OSRAM Opto Semiconductors GmbH, Regensburg (DE)

(72) Inventor: Tim Boescke, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 359 days.

(21) Appl. No.: 17/293,936

(22) PCT Filed: Nov. 20, 2019

(86) PCT No.: PCT/EP2019/081906
§ 371 (c)(1),
(2) Date: May 14, 2021

(87) PCT Pub. No.: WO2020/104515
PCT Pub. Date: May 28, 2020

(65) Prior Publication Data
US 2022/0006433 A1    Jan. 6, 2022

(30) Foreign Application Priority Data
Nov. 22, 2018  (DE) .................. 10 2018 129 488.3

(51) Int. Cl.
*H03F 3/08* (2006.01)
*H03K 3/33* (2006.01)
(Continued)

(52) U.S. Cl.
CPC ......... *H03F 3/45076* (2013.01); *H03K 3/033* (2013.01)

(58) Field of Classification Search
CPC ........ H03F 3/45076; H03F 1/342; H03F 1/42; H03F 3/082; H03F 1/22; H03K 3/033
(Continued)

(56) References Cited

U.S. PATENT DOCUMENTS

| 5,623,453 A | 4/1997 | Shinozaki |
| 6,240,048 B1 | 5/2001 | Matsubara |
| 7,868,294 B2 * | 1/2011 | Holcombe ......... H04B 10/1141 345/207 |
| 11,060,906 B1 * | 7/2021 | Wang .................. H03F 3/45475 |

(Continued)

FOREIGN PATENT DOCUMENTS

| CN | 106301228 A | 1/2017 |
| DE | 102012024488 A1 | 6/2014 |

(Continued)

OTHER PUBLICATIONS

Pliva et al.; —"Opto-electrical analog front-end with rapid power-on and 0.82 pJ/bit for 28 GB/s in 14 nm FinFET CMOS"; 30th IEEE International System-on-Chip Conference (SOCC); Sep. 5, 2017; p. 253-257; IEEE.
(Continued)

*Primary Examiner* — Hieu P Nguyen
(74) *Attorney, Agent, or Firm* — VIERING, JENTSCHURA & PARTNER mbB

(57) ABSTRACT

A transimpedance amplifier may include a voltage-controlled operational amplifier having a non-inverting input connected to ground, an inverting input receiving a current signal to be amplified, an output coupled to the inverting input via a coupling resistor, and a power-down input (PWDN input) activated upon receipt of at least one power-down signal (PWDN) such that at least one internal current source is thereupon deactivated.

13 Claims, 3 Drawing Sheets

(51) Int. Cl.
*H03F 3/45* (2006.01)
*H03K 3/033* (2006.01)

(58) Field of Classification Search
USPC .................................................. 330/308, 252
See application file for complete search history.

(56) References Cited

U.S. PATENT DOCUMENTS

| 2002/0064193 | A1 | 5/2002 | Diaz et al. |
| 2006/0127095 | A1 | 6/2006 | Deppe et al. |
| 2006/0261859 | A1 | 11/2006 | Kawano |
| 2009/0127461 | A1 | 5/2009 | Holcombe et al. |
| 2009/0163784 | A1 | 6/2009 | Sarpeshkar et al. |
| 2014/0003808 | A1 | 1/2014 | Cheng et al. |
| 2016/0367813 | A1 | 12/2016 | Pepin et al. |

FOREIGN PATENT DOCUMENTS

| EP | 0951140 A2 | 10/1999 |
| JP | 2011091688 A | 5/2011 |
| JP | 2012147312 A | 8/2012 |
| WO | 02101917 A2 | 12/2002 |

OTHER PUBLICATIONS

German Search Report issued for corresponding DE Application No. 10 2018 129 488.3, dated Sep. 6, 2019; 6 pages (for informational purpose only).

International Search Report issued for corresponding PCT Application No. PCT/EP2019/081906, dated Feb. 10, 2020, 4 pages (for informational purpose only).

* cited by examiner (State of the art)

(State of the art)

(State of the art)

TRANSIMPEDANCE AMPLIFIER AND RECEIVER CIRCUIT FOR OPTICAL SIGNALS WITH A PHOTODIODE AND A TRANSIMPEDANCE AMPLIFIER

CROSS-REFERENCE TO RELATED APPLICATIONS

The present application is a national stage entry according to 35 U.S.C. § 371 of PCT Application No. PCT/EP2019/081906 filed on Nov. 20, 2019; which claims priority to German Patent Application Serial No. 10 2018 129 488.3 filed on Nov. 22, 2018; all of which are incorporated herein by reference in their entirety and for all purposes.

TECHNICAL FIELD

The invention relates to a transimpedance amplifier and a receiver circuit for optical signals comprising a photodiode and a transimpedance amplifier.

BACKGROUND

A transimpedance amplifier is an electrical amplifier that converts an input current into a proportional output voltage. A transimpedance amplifier can also be understood as a current-controlled voltage source and is used in various fields of technology to amplify current signals. For example, current signals generated by detecting and converting an optical signal using a photodiode are known to be broadband amplified by a transimpedance amplifier. In this case, a current with a strength in the nA to μA range is converted into a voltage.

SUMMARY

Such systems are often used for distance measurement and object detection in critical applications, for example in autonomous vehicles, driver assistance systems or in medical devices such as pulse oximeters. The reliability of the measurement system here depends to a large extent on the quality of the signal processing and, in particular, on the precision and stability of the detection circuit. Since the transimpedance amplifier converts the signal of the photodiode into a usable voltage with low current, it represents an essential component of the circuit.

Of very special importance for the functionality of a transimpedance amplifier is that the highest possible gain is achieved when converting a comparatively small input current signal into an output voltage signal. This ensures that simple and reliable evaluation of the output voltage signal is possible. In this context, FIG. 5 schematically shows the circuit arrangement of a transimpedance amplifier as known from the prior art, and in which the transimpedance amplifier receives a comparatively small current signal generated by a photodiode as input signal at the inverting input.

In addition, FIG. 5 shows a transimpedance amplifier with current mirror for bias current generation. In this case, the circuit is implemented in CMOS technology. In the circuit shown in FIG. 5, only one transistor is provided to provide amplification in the circuit. Furthermore, the resistor $R_X$ and capacitance $C_X$ form a filter that minimizes noise generated in node Q1 at high frequencies.

Furthermore, a circuit arrangement for an optical receiver is known from EP 0 951 140 A2, with which optical signals are converted into electrical signals with the aid of a photodiode and the electrical signals are amplified by means of an amplifier circuit. An essential feature of the technical solution described is that a circuit arrangement is provided for setting an operating point of the amplifier circuit. This circuit arrangement is used to set the operating point as a function of a level of the optical signals. A transimpedance amplifier is used here as a preamplifier, the differential outputs of which are connected to the input of the preamplifier via a control amplifier. With this circuit arrangement, an average differential output voltage of the transimpedance amplifier used as a preamplifier is to be controlled to zero for each incoming signal, even with different level values of the optical signal. Furthermore, a level-related differential output voltage of the preamplifier is controlled to zero by means of the control amplifier, so that the subsequent processing of the signals can be performed independently of the level of the received optical signals.

Furthermore, a transimpedance amplifier with multiple amplifier stages is known from DE 10 2012 024 488 A1. In order to be able to offer an economically interesting alternative for transimpedance amplification and still be able to achieve high amplification with simultaneously large bandwidth, a transimpedance amplifier with several amplifier stages connected discretely in series is provided according to the solution proposed in this paper. The first amplifier stage is designed as a transimpedance amplification circuit, while the other stages are designed as voltage amplification circuits.

An essential property of an amplifier is always its electronic noise, which varies depending on the operating conditions and which limits the signal-to-noise ratio in the amplifier. Another specific property is the achievable bandwidth of the amplifier. Both properties are essentially related to the power consumption of a transimpedance amplifier, with amplifiers with higher power consumption in particular having less noise and higher speed. However, high power consumption is undesirable, especially in mobile applications. For this reason, technical solutions for reducing the average current consumption of a transimpedance amplifier are known.

In a special technical solution, the transimpedance amplifier is activated only when required. In this context, a multi-channel programmable transimpedance amplifier exists or existed under the type designation MTI04G, which has an integrated power-down mode. The integrated power-down mode allows the amplifier to be switched to a power-saving mode. If the integrated circuit function is temporarily not required, the quiescent current consumption can be reduced to 8 μA in this way.

If a deactivation of the transimpedance amplifier is done via a power-down input, the internal current sources in the transimpedance amplifier are deactivated when this input is activated and all nodes of the amplifier are brought to a defined state. In this regard, solutions are known in which the internal nodes of transistors are pulled either to a positive supply voltage $V_{DD}$ or to ground. With this measure it is possible to minimize leakage currents.

Based on the known transimpedance amplifiers, it is still a challenge to provide a high-quality amplifier that is characterized by minimal noise and high speed and whose power consumption is also as low as possible. However, this is particularly necessary for the use of transimpedance amplifiers in mobile devices.

If technical solutions are used that at least temporarily deactivate the transimpedance amplifier, they often have the disadvantage that it can take several microseconds until the transimpedance amplifier is ready for use again after it has been deactivated. This is due to the fact that the internal bias voltages must first settle in order to ensure reliable operation. The aforementioned problem occurs particularly when, for example, passive RC filters are used in the supply network for noise reduction. In addition, for some applications, especially those that only need to receive very short bursts at short intervals, it makes sense to reduce this settling time in order to further lower the average power consumption through even faster power gating.

A circuit in which the transimpedance amplifier used is at least temporarily switched off is shown in FIG. 3. In addition, a timing diagram shows the timing of the input signal, the power-down signal and the output signal. When the power-down input is activated, transistor Q4 pulls node X to the positive supply voltage $V_{DD}$ and thus reliably turns off the bias current. However, there is a time delay during reactivation due to the time constant of the RC noise filter and the current mirror.

Based on the transimpedance amplifier circuits known from the prior art and the problems described above, the invention is based on the task of further improving transimpedance amplifiers, in particular in a receiver circuit for optical signals, and such a receiver circuit.

The object explained above is solved with a transimpedance amplifier according to claim 1. Furthermore, said task is solved with a receiver circuit comprising the technical features indicated in claim 10.

A transimpedance amplifier may include a voltage-controlled operational amplifier having a non-inverting input which is grounded, an inverting input which receives a current signal to be amplified, an output which is coupled to the inverting input via a coupling resistor, and a power-down input which is activated upon receipt of at least one turn-off signal in such a way that at least one internal current source is subsequently deactivated. According to a non-limiting embodiment, the transimpedance amplifier has been further configured in such a way that from the turn-off or power-down signal received by the power-down input, at least a first and at least a second follow-up signal are generated by means of at least one electronic component, at least one of which initiates the deactivation of at least one internal current source, the second follow-up signal being activated after the first follow-up signal has been active for a while. The first follow-up signal will be referred to herein as the standby signal, and the second follow-up signal will be referred to as the discharge signal.

According to a non-limiting embodiment, it is thus envisaged that the problems known from the prior art are remedied with the aid of a two-stage power-down process. For this purpose, after receipt of an external switch-off or power-down signal, two signals are generated by at least one electronic component, such as by an integrated circuit, by which a subsequent action is triggered at a time interval in each case. In a non-limiting embodiment, the two follow-up signals are also generated serially, i.e. at a time interval from one another. A signal generator is provided for generating the corresponding signals, which generates or activates the desired signal when a triggering event occurs, in this case receipt of a power-down signal and/or expiry of a predetermined time period after activation of the standby signal.

With the proposed transimpedance amplifier, power consumption can be further minimized and at the same time it can be ensured that the transimpedance amplifier can be reactivated as quickly as possible after an intermediate deactivation. At the same time, the noise behavior, in particular the signal-to-noise ratio, is not negatively affected and yet the broadest possible and highest possible amplification of the received current signal is achieved. Incidentally, the amplifier circuit further formed can also be integrated comparatively easily into complex circuit arrangements and also represents an interesting solution for minimizing the average current consumption of a transimpedance amplifier from an economic point of view.

In a further aspect of a non-limiting embodiment, when the power-down input is activated by a power-down signal, an integrated circuit first generates a standby signal and, at a time interval therefrom, a discharge signal. In general, it is also conceivable that both the standby and the discharge signals are generated after the power-down signal is received, but that the discharge signal is not activated until the standby signal has already been active for a period of time determined according to requirements. Essentially, activation of the standby signal results in deactivation of at least one internal current source of the transimpedance amplifier circuit. In a non-limiting embodiment, the time span between the activation of the standby signal and the activation of the discharge signal is 90-110 s, in particular about 100 μs. Based on this proposed technical solution, activation of the discharge signal occurs only with the previously specified time offset after activation of the standby signal.

According to a special further development of a non-limiting embodiment, at least one switching transistor is activated on the basis of the first follow-up signal, i.e. the standby signal. In an advantageous manner, it is further provided that the at least one switching transistor activated by the standby signal deactivates at least one, in particular all essential current sources, of the transimpedance amplifier.

In another aspect, the at least one current source disabling switching transistor isolates the nodes of the amplifier circuit to which bias voltages are applied. This has the advantage that the normal operating state of the amplifier can be restored comparatively quickly, since the transient response of the at least one or the plurality of current sources is reduced.

After completion of the previously described measure, i.e. after activation of the standby signal, the at least one current source, such as all current sources, within the amplifier circuit is in an isolated state. This ensures that the normal operating state of the amplifier can be restored comparatively quickly, but it does not result in minimized power consumption compared to the previous operating state of the transimpedance amplifier. A problem with the isolation of the internal current sources of the transimpedance amplifier may arise if this operating state is maintained for a longer period of time, since there is then at least the possibility that undesirable system states may be reached due to drifting node voltages, which may reduce the reliability of the circuit.

Due to the previously described problem, the operating state in which at least one node to which a bias voltage is applied is isolated is maintained only for a limited period of time. The selected time period, which can be determined and changed as required, is for example 10-1000 μs or in particular 90-110 μs, very especially about 100 μs. Before or at the latest with the expiry of the aforementioned time span, the activation of the second follow-up signal, the so-called discharge signal, takes place.

According to a further aspect of a non-limiting embodiment, at least one of the nodes isolated in the first process step is short-circuited with a defined potential when the discharge signal is activated. In this way, a defined state is established in the second process step of deactivating the transimpedance amplifier. A useful feature of such a procedure is that the average current consumption and thus the power requirement of an appropriately designed transimpedance amplifier can be minimized and the amplifier can nevertheless be restored to the normal operating state comparatively quickly without unsafe operating states occurring in the meantime. Thus, a particularly fast power cycling in a range below one microsecond can be realized, so that this technical solution is also suitable for applications that are characterized by short successive bursts. Due to the technical solution described, comparatively large energy savings can thus also be achieved in such applications compared to solutions known from the prior art. The generation of the discharge signal is advantageously carried out with a monostable flip-flop.

According to another aspect of a non-limiting embodiment, at least two cascaded switching transistors are activated based on the standby signal. Advantageously, the cascaded transistors ensure that there is both rapid disconnection of the at least one current source provided in the amplifier circuit and stabilization of the bias current. As a result, the gate voltage for the cascade is generated via a common drain amplifier.

In addition, a receiver circuit for optical signals may have a photodiode, which generates a photodiode signal on the basis of received radiation, and having a transimpedance amplifier which is designed according to at least one of the embodiments described above and receives the photodiode signal and amplifies it over a broad band. As a function of incident radiation, the photodiode generates a current signal with comparatively low current intensity, in particular in the nano- or microampere range, which is fed to a transimpedance amplifier. The transimpedance amplifier thus generates an amplified voltage signal, which can be better evaluated by an evaluation unit than the original current signal. In a non-limiting embodiment, the receiver arrangement is such that the current signal generated by the photodiode is converted into a proportional voltage.

The receiver arrangement can be used, among other things, in driver assistance systems and/or autonomous vehicles for distance measurement and/or object recognition. Further possible applications are in the field of telecommunications for free space data transmission or in medical devices, for example in pulse oximeters for non-invasive measurement of the arterial oxygen content in the blood.

BRIEF DESCRIPTION OF THE DRAWINGS

In the following, without limiting the general idea, non-limiting embodiments are explained in more detail with reference to the figures.

Figure 1:
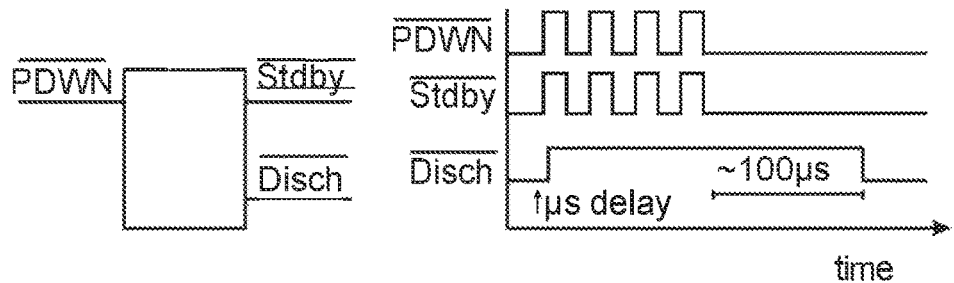
FIG. 1 shows a signal generator and timing diagram for generating the internal signals.

Further exemplary embodiments and many of the intended advantages will become apparent directly from the following detailed description. The elements and structures shown in the drawings are not necessarily shown to scale relative to each other. Like reference numerals refer to like or corresponding elements and structures.

DETAILED DESCRIPTION

Figure 4:
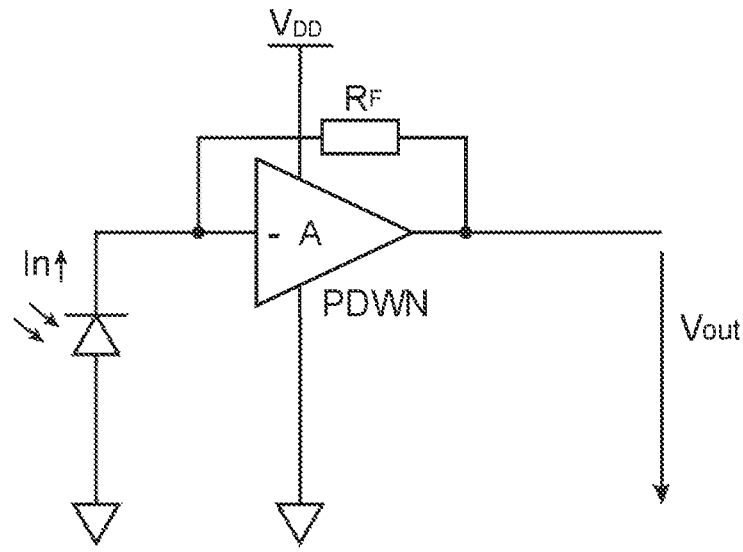
FIG. 4 shows a schematic representation of a transimpedance amplifier with photodiode as known from the prior art.
Figure 5:
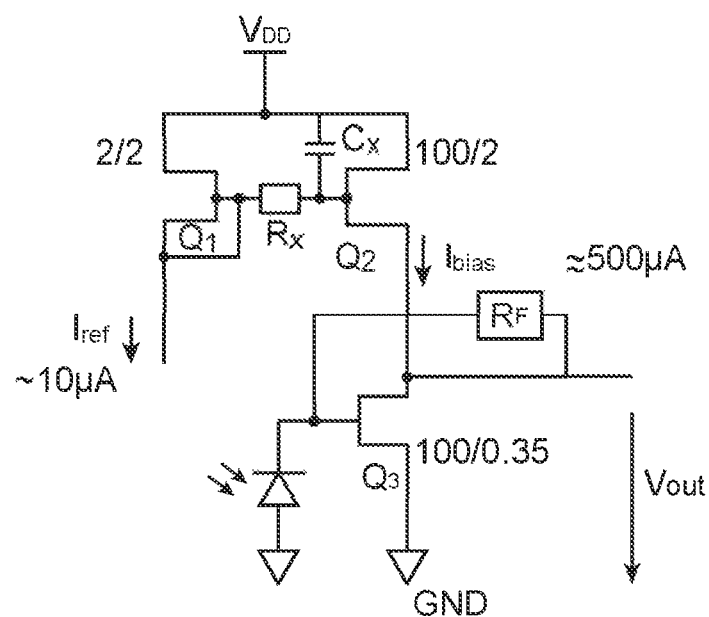
FIG. 5 shows a simplified implementation of a transimpedance amplifier with photodiode and current mirror in CMOS technology, as known from the prior art.

FIG. 4 shows a signal generator, which generates both a standby signal (STDBY) and a discharge signal (DISCHARGE) on the basis of a received power-down signal (PWDN). The generation of the two signals following the power-down signal (PWDN), i.e. standby signal (STDBY) and discharge signal (DISCH), takes place in such a way that the standby signal (STDBY) is activated first and the discharge signal (DISCH) is activated only when this has been activated for about 100 µs. The discharge signal (DISCH) thus follows the standby signal (STDBY) with a time delay of about 100 µs.

Activation of the standby signal (STDBY) by the power-down signal (PWDN) results in at least the main current sources of a transimpedance amplifier circuit being disconnected with the aid of switching transistors and the nodes being isolated with bias voltages. In this state, the operating state of the amplifier can be restored comparatively quickly because the transient response of the current sources is reduced. However, a disadvantage of this state is that the current consumption is still not reduced compared to the original state. In addition, if the state is maintained for a longer period of time, there is a risk that undesirable system states can be reached due to drifting node voltages, which can reduce the reliability of the circuit.

Due to the previously described problem, the state in which the current sources are isolated with bias voltages, i.e. float, is only maintained for a short time. After the standby signal (STDBY) is activated for 100 µs, the signal generator activates the discharge signal (DISCH) in a subsequent process step. Due to the activation of the discharge signal (DISCH), all floating nodes of the circuit arrangement are short-circuited with a defined potential, so that a defined state is established.

The timing diagram shown in FIG. 1 shows the signal characteristics of the power-down signal (PWDN), the standby signal (STDBY) and the discharge signal (DISCHARGE). It can be clearly seen that the standby signal (STDBY) immediately follows the power-down signal (PWDN), while the discharge signal (DISCH) is activated 100 µs after a switching operation has been triggered by the standby signal (STDBY), by which the essential current sources have been disconnected. The activation of the Discharge signal (DISCH) initiates a second process step of the power-down process, in which all floating nodes are short-circuited with a defined potential.

Figure 2:
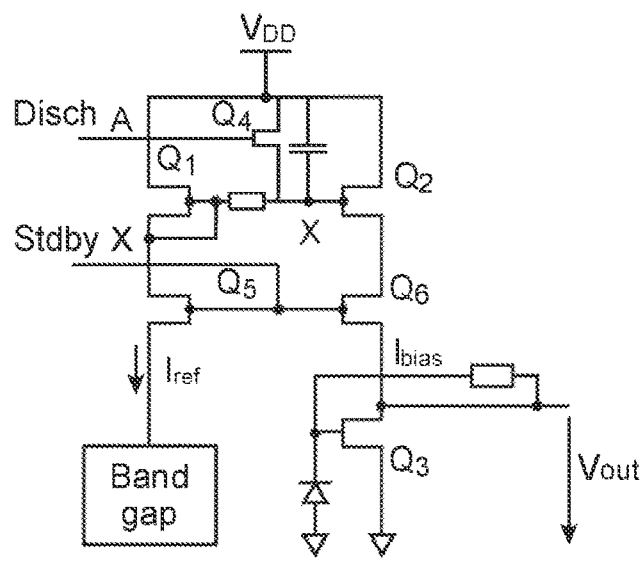
FIG. 2 shows a transimpedance amplifier with transistors for separating the bias current.

FIG. 2 shows a non-limiting embodiment in which the current signal generated by a photodiode is amplified by a transimpedance amplifier. According to this embodiment forum, transistors Q5 and Q6 are provided, which are connected as a cascade. A power-down signal (PWDN) at the input of a signal generator not shown here activates a standby signal (STDBY) and a discharge signal (DISCH) generated for this purpose with a time delay.

As soon as the standby signal (STDBY) is activated, the cascade-connected transistors switch off the bias current without disturbing the potential at the gate of the current mirror X. In the embodiment example shown in FIG. 2, the current mirror represents a current-controlled current source that is disconnected as needed using the cascade-connected transistors Q5 and Q6, and the node is isolated with bias voltage. In this case, the two cascade-connected transistors Q5 and Q6 are used to rapidly disconnect and stabilize the bias current simultaneously.

The gate voltage for the cascade connection of transistors Q5 and Q6 is generated via a common drain amplifier.

The resistor R as well as the capacitor C form a passive RC filter which reduces the noise generated by Q1 at high frequencies. In order to at least reduce a delay in reactivation due to the time constant of the RC noise filter and the current mirror X after a deactivation of the transimpedance amplifier, the power-down process takes place in two steps.

Therefore, with a time delay of 100 µs after the standby signal (STDBY) has been activated, a discharge signal (DISCH) is activated, short-circuiting the current mirror X disconnected in the first step with a defined potential. In the present case, this node is pulled to $V_{DD}$. This action establishes a defined state with a simultaneous reduction in power consumption, from which the transimpedance can be reactivated comparatively quickly to its normal operating state. The generation of the discharge signal (DISCH) is done in an advantageous way with a monostable flip-flop.

Figure 3:
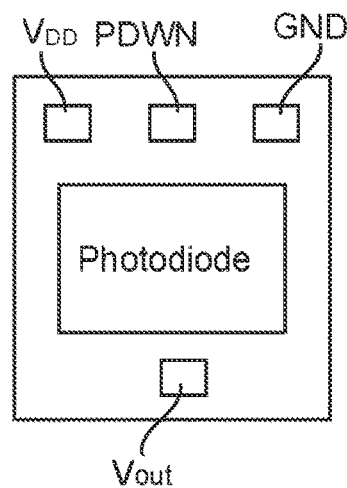
FIG. 3 shows an integrated optical receiver with photodiode and transimpedance amplifier.

FIG. 3 shows a chip with an integrated circuit that has a photodiode and a transimpedance amplifier. The transimpedance amplifier amplifies the current signal generated by the photodiode to enable better evaluation of the signal by generating a proportional voltage based on the received current signal.

An essential feature of the technical solution shown in FIG. 3 is that the chip has a power-down input (PWDN input) so that the transimpedance amplifier can be specifically deactivated to minimize the average power consumption of the electronic component. When the power-down signal (PWDN) is activated via the power-down input, both a standby signal (STDBY) and a discharge signal (DISCH) are generated using an integrated switching generator. Based on the standby signal (STDBY), switching transistors are first used to disconnect the internal power sources and isolate the nodes with bias voltages. After the standby signal (STDBY) has already been active for 100 µs, the discharge signal (DISCH) is activated, short-circuiting all floating nodes with a defined potential so that a defined state is established.

Due to the two-stage power-down process used, the average power consumption of the chip is reduced and yet the operational readiness and reliability of the chip and the circuit used are not reduced.

Figure 6:
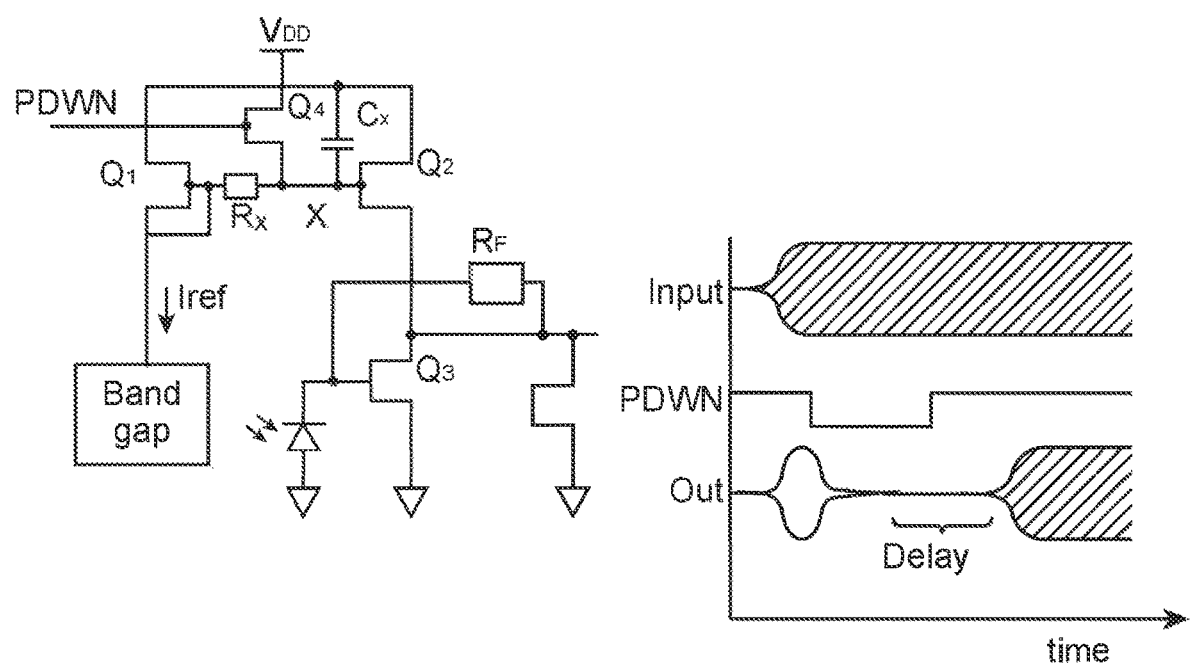
FIG. 6 shows a circuit and timing diagram of a transimpedance amplifier with power-down input, as known from the prior art.

The chip shown in FIG. 6 can advantageously be used in a driver assistance system or in an autonomous vehicle for distance detection and/or object detection.

It is also conceivable to use such a chip with photodiode and transimpedance amplifier in a medical device, for example in a pulse oximeter for non-invasive determination of arterial oxygen saturation in the blood. In pulse oximetry, light absorption or light emission is measured when the skin is transilluminated. The pulse oximeter is a spectrophotometer specially optimized for this application, in which the photodiode built into the chip shown in FIG. 6 is used to detect the light radiation emitted by the body. To ensure accurate measurement, the current signal generated by the photodiode is amplified and converted into a proportional voltage by means of a transimpedance amplifier.

The chip with integrated optical receiver shown in FIG. 6, which uses a transimpedance amplifier or a receiver arrangement, can be used in a particularly suitable manner for the aforementioned applications, since very fast power cycling in a time range of less than a microsecond can occur, and considerable energy savings are also possible in applications with short successive bursts compared to known systems.

LIST OF REFERENCE SIGNS

PWDN Power-down signal
STDBY Standby signal
DISCH Discharge signal
PWDN input Power-down input
Q Transistor
R Resistance
C Capacity

The invention claimed is:

1. A transimpedance amplifier comprising:
a voltage controlled operational amplifier comprising:
a non-inverting input grounded in an operation of the operational amplifier;
an inverting input configured to receive a current signal to be amplified;
an output coupled to the inverting input via a coupling resistor; and
a power-down input (PWDN input) configured to be activated on receipt of at least one power-down signal (PWDN) in such a way that at least one internal power source is then deactivated;
wherein, in operation, at least a first and at least a second follow-up signal are generated from the power-down signal (PWDN) received from the power-down input (PWDN input) by means of at least one electronic component, at least one of which initiates the deactivation of at least one internal current source, the second follow-up signal being activated after the first follow-up signal has been active for a time interval.

2. The transimpedance amplifier of claim 1,
wherein at least two of the following signals are configured to be generated in an integrated circuit based on the power-down signal (PWDN) received from the power-down input (PWDN input).

3. The transimpedance amplifier according to claim 1,
wherein the time interval between the generation of the first and the activation of the second follow-up signal ranges from 90 to 110 µs.

4. The transimpedance amplifier according to claim 1,
further comprising a monostable flip-flop configured to generate at least one of the at least two follow-up signals.

5. The transimpedance amplifier according to claim 1,
wherein at least one current source is disconnected based on the first sequence signal.

6. The transimpedance amplifier according to claim 1,
further comprising at least one switching transistor (Q) is configured to be activated based on the first sequence signal.

7. The transimpedance amplifier according to claim 1,
further comprising at least one node to which a bias voltage is applied is isolated based on the first sequence signal.

8. The transimpedance amplifier of claim 7,
wherein when the second follow-up signal is activated, the at least one node to which a bias voltage is applied is short-circuited with a defined potential.

9. The transimpedance amplifier of claim 8,
further comprising a monostable flip-flop configured to generate the second follow-up signal.

10. The transimpedance amplifier according to claim 1,
wherein at least two switching transistors connected as a cascade are activated based on the first sequence signal.

11. The transimpedance amplifier of claim 10, wherein a gate voltage for the cascade is generated via a common-drain amplifier.

12. An optical signal receiver circuit comprising:
a photodiode configured to generate a photodiode signal based on received radiation; and
a transimpedance amplifier according to claim 1 configured to receive and broadband amplifies the photodiode signal.

13. The receiver circuit of claim 12, wherein a current signal generated by the photodiode is converted into a proportional voltage.

* * * * *